United States Patent [19]
Ciccarelli et al.

[11] Patent Number: 5,324,968
[45] Date of Patent: Jun. 28, 1994

[54] CCD IMAGE SENSOR

[75] Inventors: Antonio S. Ciccarelli; Herbert J. Erhardt, both of Rochester, N.Y.

[73] Assignee: Eastman Kodak Company, Rochester, N.Y.

[21] Appl. No.: 154,803

[22] Filed: Nov. 18, 1993

[51] Int. Cl.$^5$ .............................. H01L 29/78
[52] U.S. Cl. ........................ 257/222; 257/232; 257/234; 348/311
[58] Field of Search .............. 257/232, 233, 234, 222, 257/446, 465; 358/213.19, 213.23

[56] References Cited

U.S. PATENT DOCUMENTS

| | | | |
|---|---|---|---|
| 4,744,057 | 5/1988 | Descure et al. ................. | 257/232 |
| 4,980,735 | 12/1990 | Yamawaki ..................... | 257/222 |
| 5,051,797 | 9/1991 | Erhardt ........................ | 357/24 |
| 5,066,994 | 11/1991 | Erhardt ........................ | 257/222 |
| 5,235,196 | 8/1993 | Anagnostopoulos et al. ..... | 257/234 |

OTHER PUBLICATIONS

Declerck et al, A 3456 Element Quadrilinear CCD With Depletion-Isolated Sensor Structure, IEDM Technical Digest 1983, pp. 505-508.

Primary Examiner—Edward Wojciechowicz
Assistant Examiner—Courtney A. Bowers
Attorney, Agent, or Firm—Raymond L. Owens

[57] ABSTRACT

An image sensor having on a substrate of a first conductivity type an implanted region of a conductivity type opposite to the first conductivity type and an implanted region of the same conductivity type as the substrate, the image sensor comprising a plurality of depleted photosensitive regions in which electric charges are generated, an isolation region being formed between adjacent photosensitive regions to isolate the photosensitive regions from each other. Charge accumulation regions and transfer regions are also provided to transport the electric charges from the photosensitive regions to CCD shift registers. The isolation regions between two depleted photosensitive regions are formed of undepleted regions. The implanted region of the opposite conductivity type is of a smaller width throughout the photosensitive regions than throughout the charge accumulation regions and the transfer regions.

5 Claims, 8 Drawing Sheets

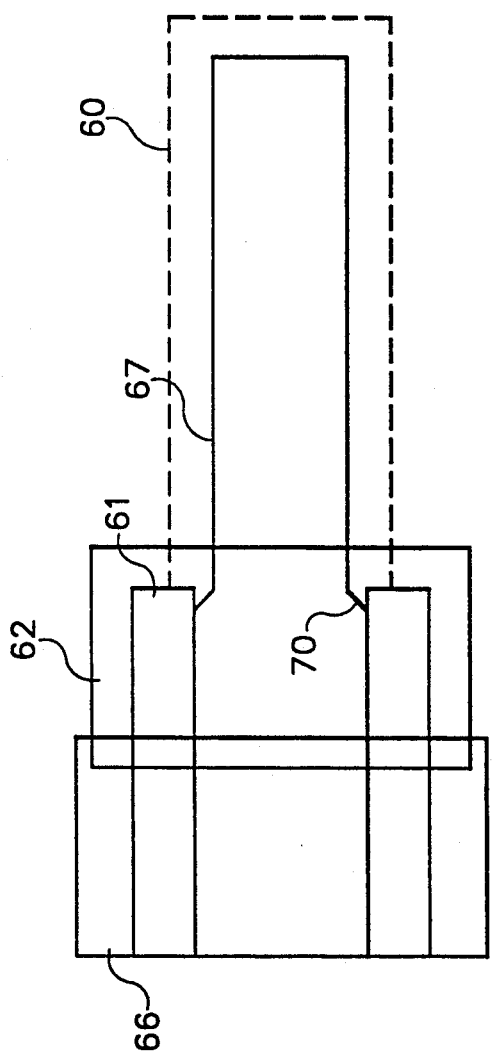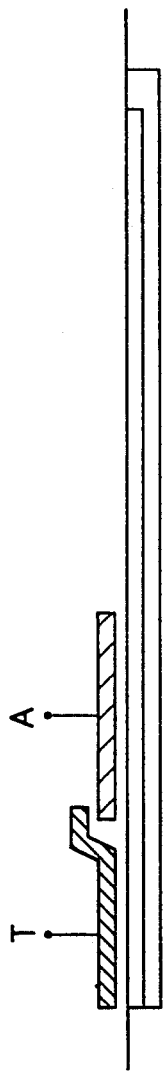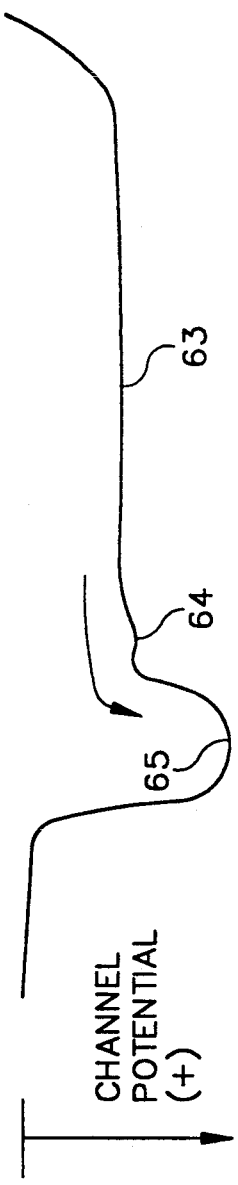

CCD IMAGE SENSOR

FIELD OF THE INVENTION

The present invention relates to a CCD image sensor of the type having a plurality of image cells.

BACKGROUND OF THE INVENTION

Photodetector imagers, in general, comprise a plurality of photodetectors arranged in either a linear or area array. Along the linear array of the photodetectors or along each column of photodetectors in an area array is a transfer device for carrying the charges collected in the photodetectors to read-out circuitry. One transfer means commonly used is a Charge Coupled Device (CCD). The photodetectors commonly used are either a photogate detector or a photodiode detector.

FIG. 1 to which it is now made reference schematically represents a conventional image sensor such as disclosed in commonly-assigned U.S. Pat. No. 5,051,797 issued Sep. 24, 1991 to H. J. Erhardt, and comprised of a plurality of image cells 1. The image sensor comprises a substrate (semiconductor body), typically of a semiconductor material, such as a p-type single crystalline silicon on which photodetectors are formed by at least one implanted region of a conductivity type opposite to the one of the substrate and an implanted region of the same conductivity type as the substrate. Such a substrate, along with its implanted regions, defines for each image cell 1 a photosensitive region 10 for generating electric charges. Adjacent to the photosensitive region 10 is an accumulation region 11 for collecting the electric charges outside the photosensitive region. Typically, the accumulation region is formed by a conductive gate of a conductive material, such as metal or conductive polycrystalline silicon.

Electrode means are provided over the accumulation region for applying a constant potential to the accumulation region so that the electric charges generated by the photosensitive region 10 are continuously gathered in the accumulation region 11. Such electrode means are of the same type as those shown in FIG. 6B which will be used for the description of the present invention. The image cell also comprises CCD shift registers for transporting the electric charges to an output device (not shown). Typically such a shift register is comprised of two gates 13 and 14. As an example, such a shift register is comprised of a n-type conductivity channel region in the substrate. The channel region extends along the surface spaced from and parallel to the line of the accumulation regions 11. Over the channel region are a plurality of conductive gates 13 and 14. The gates may be made of a metal or conductive polycrystalline silicon. The gates are connected to bus lines (not shown) and to a potential source (not shown) for selectively applying a potential to the gates 13, 14 to operate the shift registers.

Between each accumulation region 11 and each shift register is a transfer region 12 to permit the transfer of the electric charges from the accumulation region 11 to the shift registers. Electrode means are provided over the transfer region to selectively lower the potential of the transfer region under the potential level of the accumulation region so that the transfer of the charges can be performed. Such electrode means are of the same type as those T shown in FIG. 6B.

In operation of the image sensor, a potential is applied to the electrode of the accumulation regions 11 so as to deplete them. This also induces a potential well in the photosensitive region 10, which well in each accumulation region which is deeper than the potential well 23 of the photosensitive region 10. Thus, during the integration period during which time the image sensor is subjected to scene illumination, as charge carriers are generated in each photosensitive region 10, the charge carriers diffuse or drift into its contiguous accumulation region.

As it appears in FIG. 2A to which it is now made reference, and which shows a cross-section view of the image sensor of FIG. 1, isolation regions 21 are provided between the image cells 20 to isolate the image cells from each other. Generally, the isolation regions are comprised of thick field oxide grown between two adjacent cells. Typically, such field oxide isolation regions are provided on a length which is sufficient to isolate the photosensitive regions from each other and the accumulation regions and transfer regions from each other.

Such isolation regions pose several problems to this kind of image cell structure, primarily due to the fact that after a channel stop region is patterned, the subsequent growth of the field oxide causes a lateral extension of the isolation region to occur, forming a "bird's beak" structure as it is commonly known in the prior art. This encroachment can have a typical length of 0.5 $\mu$m to 1.0 $\mu$m into the active region depending on the process steps involved. The channel stop is a region of near zero electric field and carriers travel through this region by diffusion. This results in a higher diffusion crosstalk between adjacent photodiodes which degrades the Modulation Transfer Function (MTF) and reduces the collection efficiency of the photodiode. This effect also tends to limit the smallest cell size achievable. These concerns are of utmost importance in the design and manufacture of high resolution image sensors.

A potential solution has been proposed in the article entitled "A 3456 Element Quadrilinear CCD with Depletion-Isolated Sensor Structure" by Declerck et al, IEDM Technical digest 1983, pp. 505–508. The sensor disclosed in this article comprises a plurality of image cells which are only separated from each other by the depletion region of the p-n junctions. No field doping, thick oxide or poly-gate isolation is used. However, as acknowledged by the authors of the article, depletion isolation sensors have been shown to have the disadvantage of the detector varying in width with respect to the signal charge level. The width variation in these sensors is due to the change in potential profiles caused by the collection of electrons. This problem consequently degrades the sensor MTF as well. Furthermore, a photosite with a depletion region isolation without any accumulation region, will exhibit a reduced charge collection efficiency due to the potential well collapsing during integration.

SUMMARY OF THE INVENTION

Accordingly, it is one of the objects of the present invention to provide an image sensor that eliminates the problems mentioned in the above discussion with respect to conventional image sensors.

These objects are achieved by providing an image sensor having on a substrate of a first conductivity type an implanted region of a conductivity type opposite to said first conductivity type and an implanted region of the same conductivity type as the substrate, the image sensor comprising:

(a) a plurality of depleted photosensitive regions in which electric charges are generated, an isolation region being formed between adjacent photosensitive regions to isolate the photosensitive regions from each other;

(b) accumulation regions adjacent to the photosensitive regions for collecting the electric charges outside the photosensitive regions, electrode means being provided over the accumulation regions for applying a constant potential to the accumulation regions so that the electric charge can be continuously gathered into the accumulation regions, oxide being grown between two adjacent accumulation regions so as to isolate the accumulation regions from each other; and (c) shift registers for transporting the electric charges to an output device, transfer regions being provided between the accumulation regions and the shift registers to permit the transfer of the electric charges between the accumulation regions and the shift registers; wherein:

(i) the isolation regions between two depleted photosensitive regions are formed of undepleted regions; and (ii) the implanted region of the opposite conductivity type is of a smaller width throughout the photosensitive regions than throughout the charge accumulation regions and the transfer regions.

These and other objects of the present invention will become more apparent when taken in conjunction with the following description and drawings which form a part of the present description.

The following are advantages of the invention: The photodiode cell structure successfully eliminates the problems of reduced diffusion MTF with reduced cell sizes. It also eliminates the problem of reduced collection efficiency, and of diode width variation during integration. It offers a diode structure, without field oxide, and an adjacent accumulation region to drain charge from the diode and maintain the diode potential profile. This structure will result in lower diffusion crosstalk and better MTF performance.

BRIEF DESCRIPTION OF THE DRAWINGS

FIGS. 6A-6C represent another plan view of the image sensor of FIG. 4 along with another cross section view and its channel potential diagram.

DETAILED DESCRIPTION OF THE INVENTION

Figure 1:
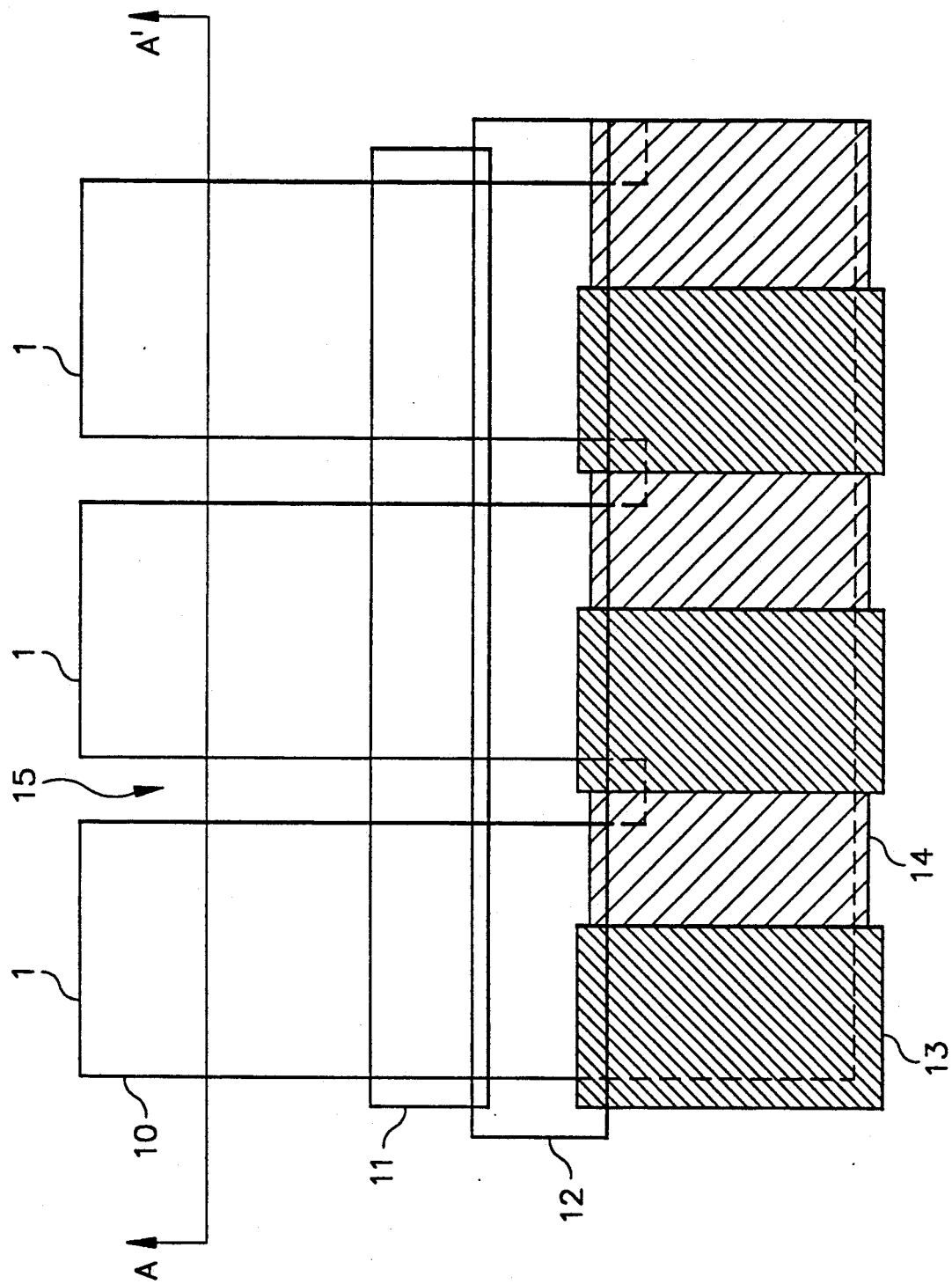
FIG. 1 is a plan view of a conventional photodiode.
Figure 2A:
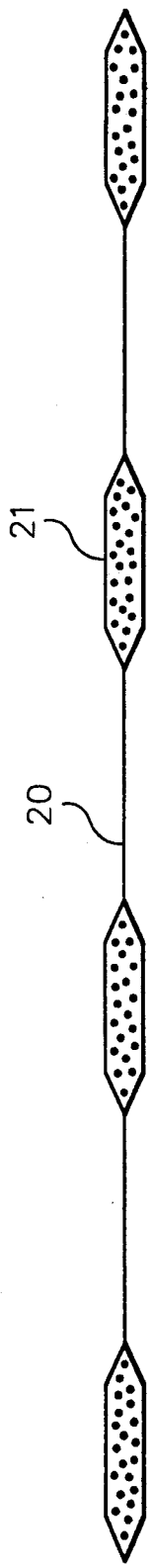
FIGS. 2A-2B show a cross section view along line AA' of the conventional photodiode of FIG. 1 along with a channel potential diagram through line AA'.
Figure 2B:
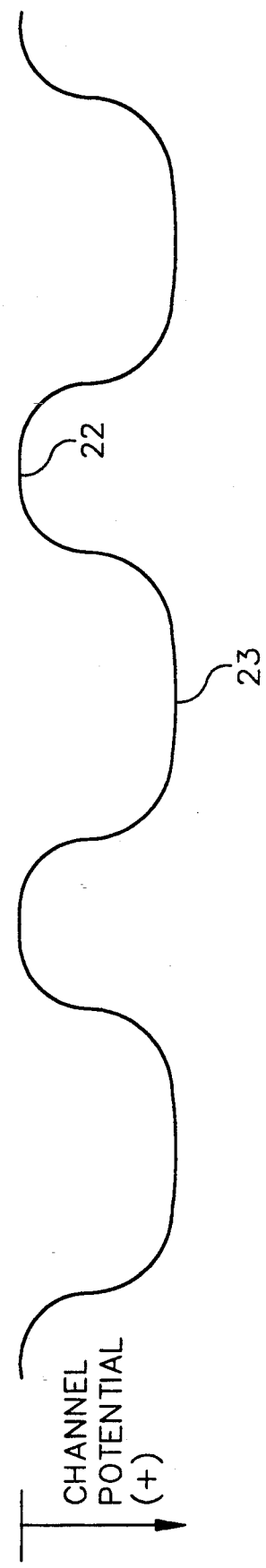

The image sensor according to the invention is basically of the same type of the one described in reference to FIG. 1. The detailed description which follows will focus essentially on the unique features of the device according to the invention. The image sensor represented in FIG. 3 comprises a substrate 38 of one conductivity type, such as a p-type single crystalline silicon on which are formed an implanted region of the same conductivity type 30 and at least one implanted region of the opposite conductivity type. According to the preferred embodiment shown in FIG. 3, two implanted regions 31 and 32 of the opposite conductivity type are used. The image sensor comprises a plurality of photosensitive regions 29 for generating electric charges. Also shown is a charge accumulation region 33 adjacent to each photosensitive region 29, a transfer region 34, and a CCD readout register with two gates 35 and 36 per image cell.

Figure 4A:
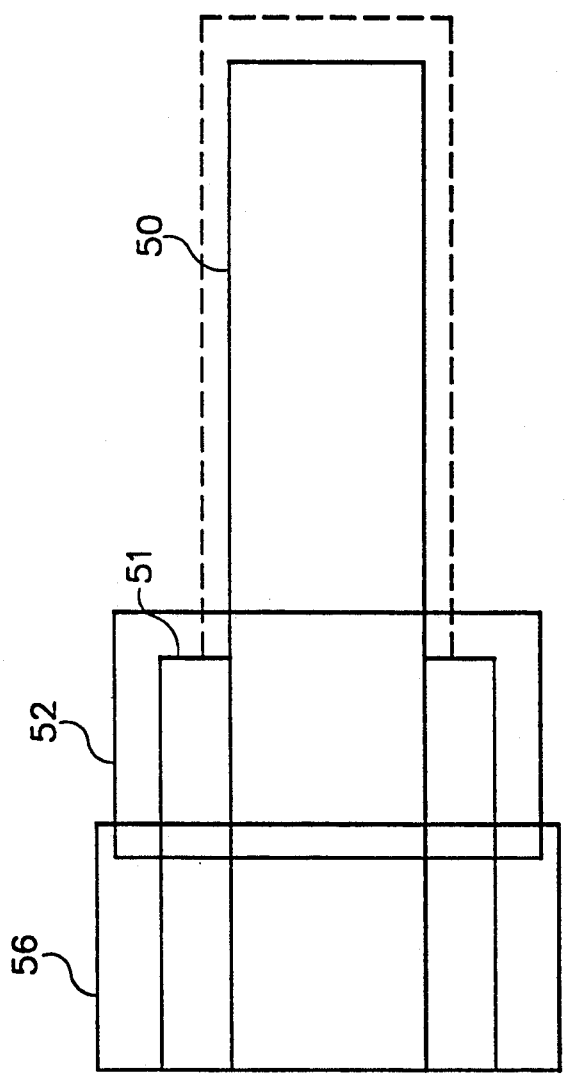
FIGS. 4A-4B represent another plan view of a photodiode according to the invention along with its corresponding channel potential diagram.

An electrode (A; FIG. 6B) over the accumulation region 33 is DC biased to allow the charges that are generated in the photosensitive regions 29 to be continuously gathered into the accumulation region 33. This means for continually draining charge from the diodes causes the diode potential profile to remain constant during integration. According to an important feature of the invention, the isolation between two adjacent depleted photosensitive regions is realized by an undepleted region 39 provided between adjacent image cells. On the other hand, isolation between two adjacent accumulation regions 33 and transfer regions 34 is still ensured by conventional field oxide areas 37 which are grown between such adjacent accumulation regions. This also appears in FIG. 4A in which the thick field oxide 51 is provided only at the accumulation and transfer regions 52 and 56.

Figure 3:
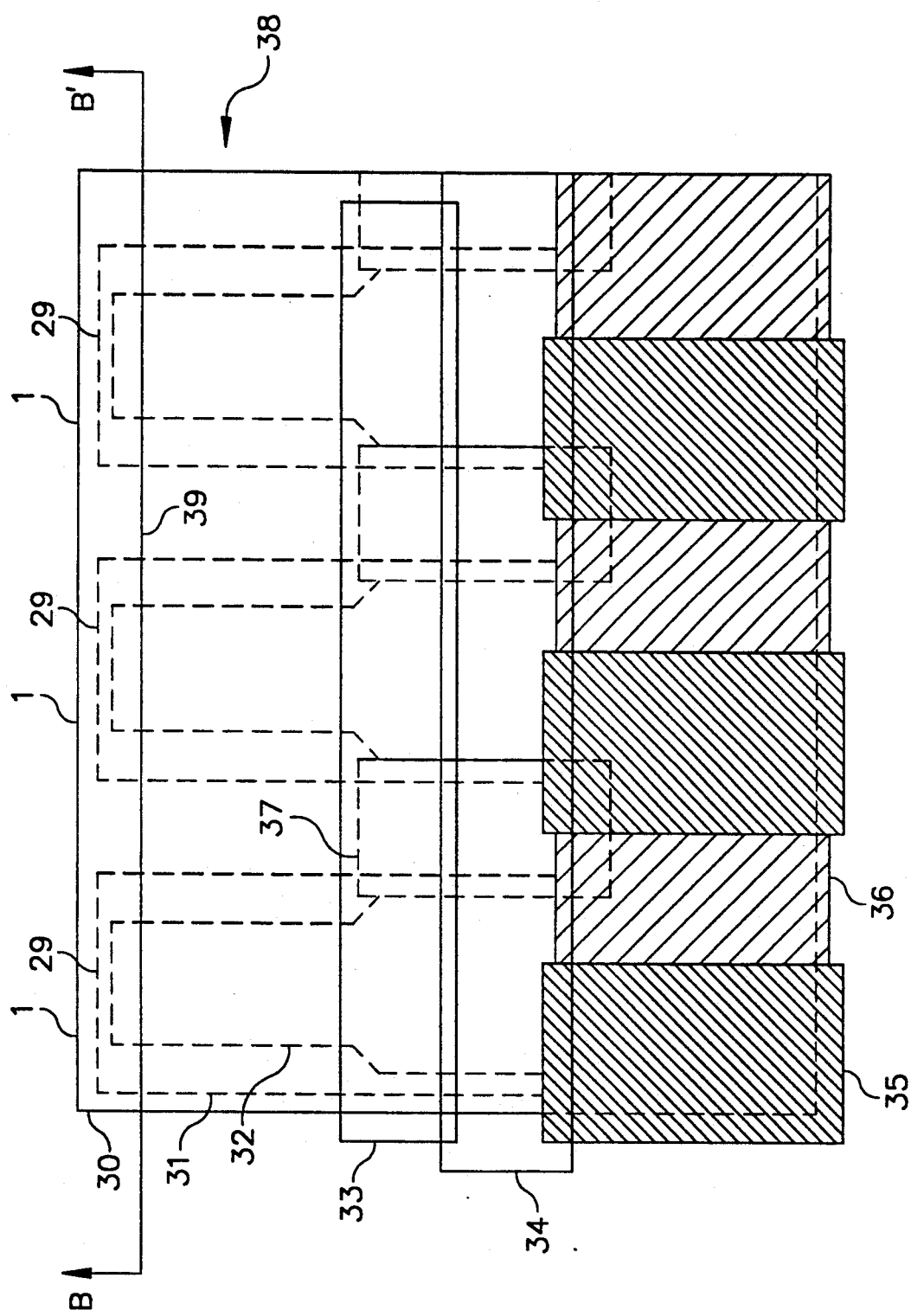
FIG. 3 shows a plan view of an embodiment of the image sensor according to the present invention.
Figure 5A:
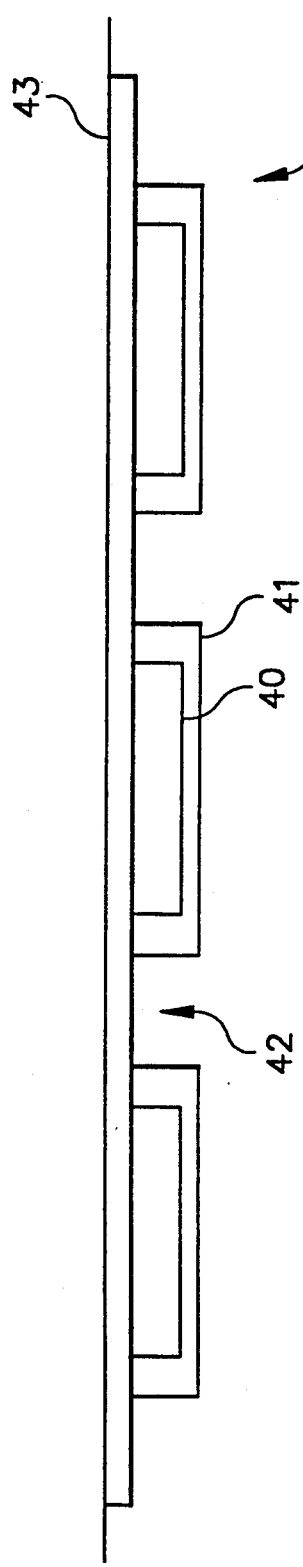
FIGS. 5A-5B represent a cross section view along line BB' of the image sensor shown in FIG. 4 along with its channel potential diagram through line BB'.

FIG. 5A shows a cross section view of the image sensor shown in FIG. 3. FIG. 5A shows the substrate 44, an implanted region 43 of the same conductivity type as the substrate 44 and two implanted regions 40 and 41 of the opposite conductivity type. Also shown is the depleted isolation region 42 between two adjacent photosensitive regions.

Figure 5B:
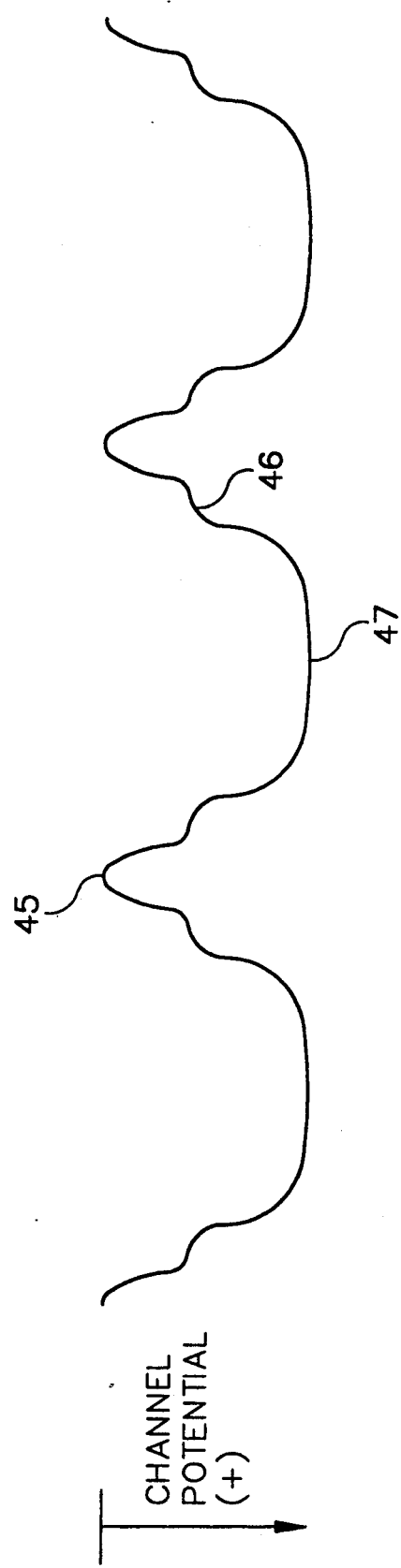

The associated channel potential diagram is illustrated in FIG. 5B. The potential level 45 located between adjacent photo-sites forms an isolation region without having a field oxide grown. The potential level 45 is determined by the substrate 44 of one conductivity type and the implanted region 43 of a similar conductivity type. The next level 46 is determined by the substrate 44 of one conductivity type, the implanted region 43 of the same conductivity type and the implanted region 41 of the opposite conductivity type. Such an intermediate level 46 occurs only if two opposite conductivity type implants 40, 41 are used as shown in FIG. 5A. If only one opposite conductivity type implant is used, level 46 will not exist. The final photo-site level 47 is determined by the substrate 44, the implanted region 43 of the same conductivity type, and the two implanted regions 40, 41 of the opposite conductivity type. As already mentioned, since this cell structure utilizes an accumulation region adjacent to each photo-site, these potential levels remain relatively unchanged during operation, thus forming the necessary isolation between two adjacent photo-cells.

Figure 4B:
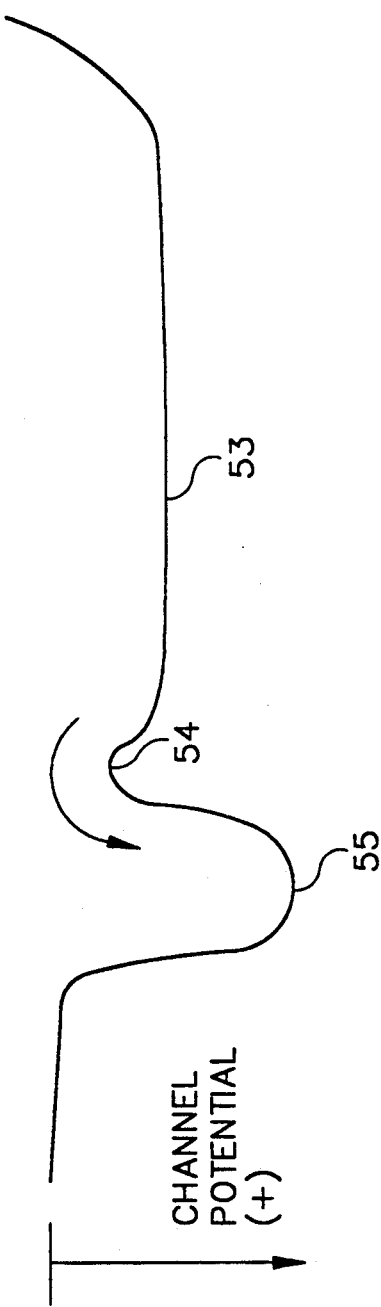

FIG. 4B illustrates the drawback of such an embodiment, i.e. of having isolation field oxide areas between two adjacent accumulation regions. To summarize, the introduction of the field oxide isolation region 51 causes a narrowing channel effect, depending on processing characteristics. Such a narrowing effect introduces a barrier 54 that impedes the movement of the electrons as they are forced from the photo-site 53 to the accumulation region 55. This effect hinders the performance of the image device by causing some electrons to remain in the photo-site 53 and which are never transferred out to the CCD registers.

This problem is solved in a preferred embodiment of the present invention by having the implanted region (of opposite conductivity type) of varying width. According to the device shown in FIG. 4A, the implanted region 50 is of uniform width all along the photocell. According to a preferred embodiment of the invention shown in FIG. 6A, the implanted region 67 is of greater width at the accumulation and transfer regions 62 and 66 than at the diode regions. Preferably, the difference of widths is of at least 1 $\mu$m. However, in order to maintain a high resolution, this difference of width should not be too large. In fact, the distance between two successive field oxides (throughout the accumulation and transfer regions), including the reduction due to the "bird's beak" encroachment should be greater than the width of the implanted region at the photosensitive region. According to the preferred embodiment shown in FIG. 6A, a tapered portion 70 is provided between two portions of different widths of said implanted region 67. This difference of width, as shown in FIG. 6C, introduces electric fields 64 that overcome the above mentioned field oxide barrier, thus producing a larger force to aide the movement of electrons from the photo-site level 63 to the accumulation region potential 65. Consequently, at the end of the integration period, the electrode (T; FIG. 6B) provided over the transfer region is biased to allow the electrons to move from the accumulation regions 62 into the CCD register, and then to be shifted out to the output stage.

Figure 7A:
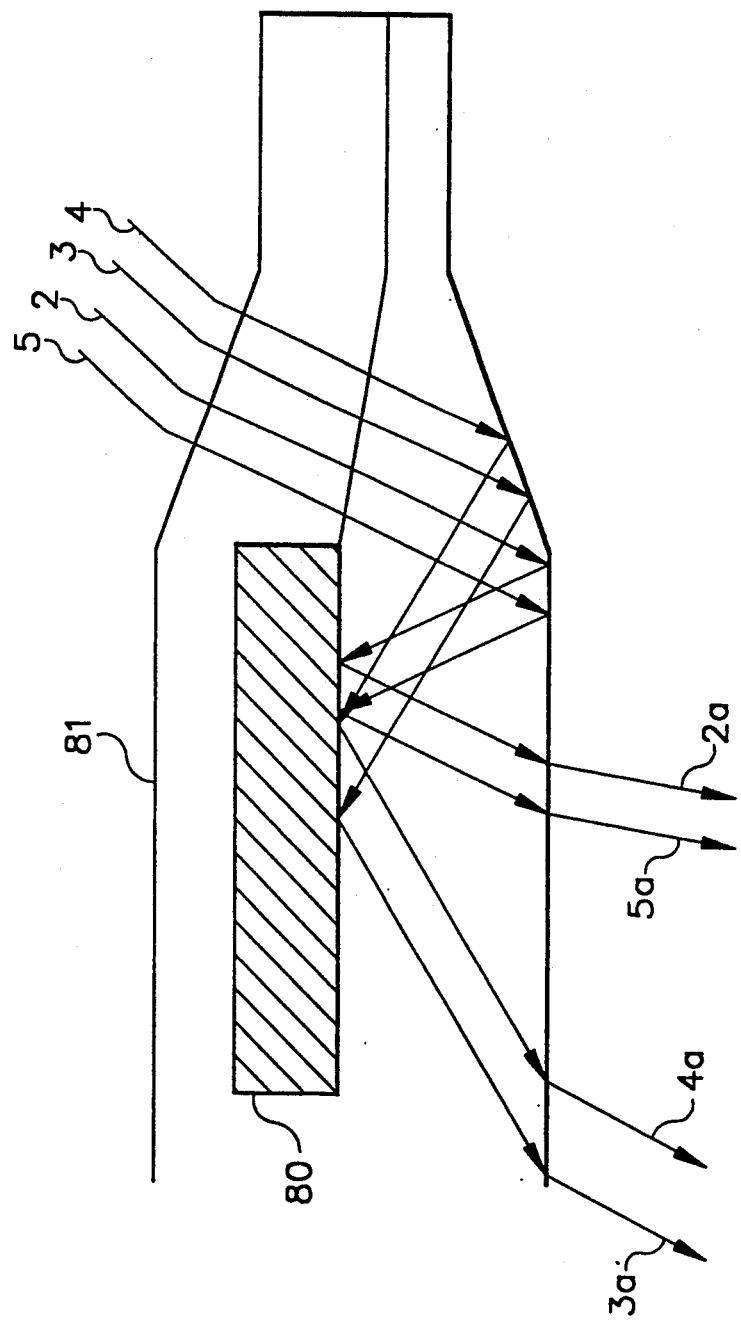
FIGS. 7A-7B illustrate schematically the influence of the "light piping" effect of the image sensor of the invention compared with a conventional device.
Figure 7B:
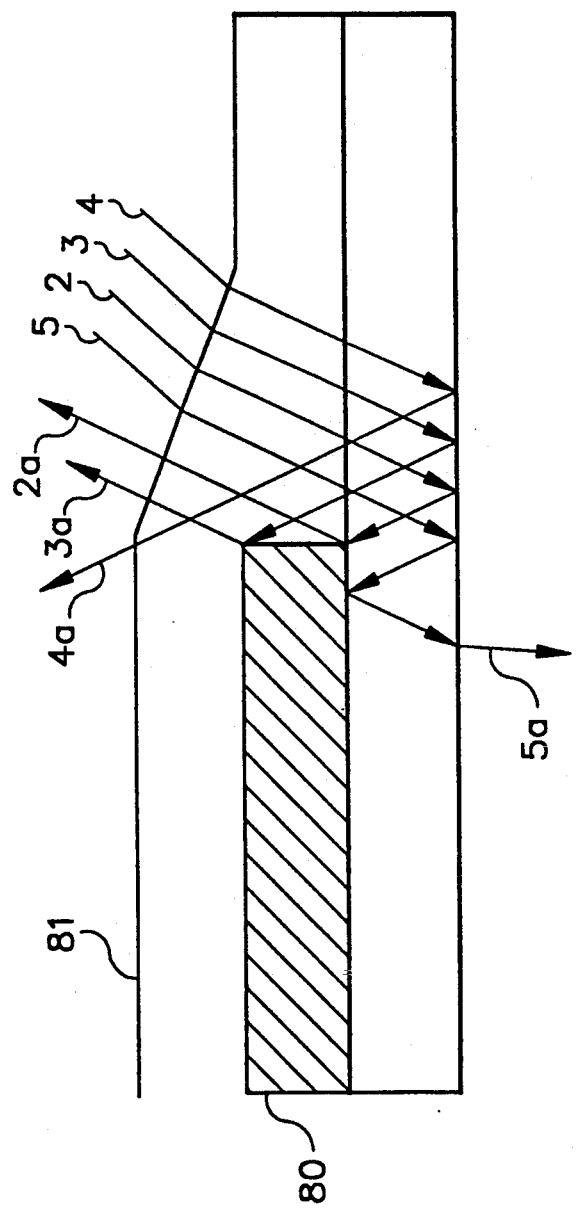

Another advantageous effect of having no thick field oxide between adjacent photo-sites will be now described in detail in reference to FIGS. 7A-7B. Both of these figures show a cell architecture where a light shield layer 80 is used between two adjacent photo-sites to reduce the pixel aperture. FIG. 7A shows a conventional device having a thick field oxide area 81 between two adjacent photo-sites. FIG. 7B shows the isolation region of the sensor according to the invention without any thick field oxide between two adjacent photo-sites. The geometry of the isolation region of a conventional device (FIG. 7A), causes the collection efficiency to be reduced and the crosstalk to increase. As shown in FIG. 7A, because of the geometry of the device, incident light rays 2-5 are refracted and directed toward adjacent photo-sites (see rays 2a-5a) thus increasing crosstalk. According to the invention, since the thick field oxide is eliminated between detection areas, the above mentioned detrimental geometry is not created. As shown in FIG. 7B, most of the incident light rays 2-5 impinging thereon are reflected at a much higher angle, and therefore cannot be collected by adjacent photo-sites, thereby decreasing the crosstalk and increasing the collection efficiency.

The processes to be used for producing the image sensor according to the invention are conventional well known photo-lithographic processes, including among others, masking, etching, patterning steps. Such processes have been widely described in the patent literature and therefore, do not need any further description.

The invention has been described in detail with particular reference to certain preferred embodiments thereof, but it will be understood that variations and modifications can be effected within the spirit and scope of the invention.

What is claimed:

1. An image sensor having in a substrate of a first conductivity type an implanted region of a conductivity type opposite to said first conductivity type and an implanted region of the same conductivity type as said substrate, said image sensor comprising:
   (a) a plurality of spaced depleted photosensitive regions in which electric charges are generated, an isolation region being formed between adjacent photosensitive regions to isolate said photosensitive regions from each other;
   (b) accumulation regions adjacent to said photosensitive regions for collecting said electric charges outside said photosensitive regions, electrode means being provided over said accumulation regions for applying a constant potential to said accumulation regions so that said electric charge can be continuously gathered into said accumulation regions, oxide being grown between two adjacent accumulation regions so as to isolate said accumulation regions from each other; and
   (c) shift registers for transporting said electric charges to an output device, transfer regions being provided between said accumulation regions and said shift registers to permit the transfer of said electric charges between said accumulation regions and said shift registers; wherein:
      (i) said isolation regions between two depleted photosensitive regions are formed of undepleted regions; and
      (ii) said implanted region of said opposite conductivity type is of a smaller width throughout one of the photosensitive regions than throughout a respective charge accumulation region and a respective transfer region.

2. An image sensor according to claim 1 wherein said substrate is a p-type conductivity substrate.

3. An image sensor according to claim 1 further comprising a second implanted region of said opposite conductivity type.

4. An image sensor according to claim 1 wherein said implanted region of said opposite conductivity type defines two portions of different widths including said smaller width, a tapered portion being provided between said two portions.

5. An image sensor according to claim 4 wherein the difference of widths between said two portions is at least 1 $\mu$m.

* * * * *